(12) United States Patent
Zhang et al.

(10) Patent No.: US 6,445,314 B1
(45) Date of Patent: Sep. 3, 2002

(54) SYSTEM AND METHOD FOR THE DECODING OF VARIABLE LENGTH CODES

(75) Inventors: Ji Zhang; Fang Wu, both of San Jose, CA (US)

(73) Assignee: Cisco Technology Inc., San Jose, CA (US)

( * ) Notice: Subject to any disclaimer, the term of this patent is extended or adjusted under 35 U.S.C. 154(b) by 0 days.

(21) Appl. No.: 09/516,916

(22) Filed: Mar. 1, 2000

(51) Int. Cl.$^7$ ................................................ H03M 7/00
(52) U.S. Cl. ........................................... 341/67; 341/65
(58) Field of Search .............................. 341/67, 63, 65, 341/106; 375/340

(56) References Cited

U.S. PATENT DOCUMENTS

| | | | | |
|---|---|---|---|---|
| 5,668,548 A | * | 9/1997 | Bakhmutsky | 341/67 |
| 5,710,561 A | * | 1/1998 | Schmidt et al. | 341/63 |
| 5,736,945 A | * | 4/1998 | Kinouchi et al. | 341/63 |
| 5,901,177 A | * | 5/1999 | Sohn | 375/240 |
| 6,011,498 A | * | 1/2000 | Wittig | 341/67 |
| 6,215,424 B1 | * | 4/2001 | Cooper | 341/67 |

OTHER PUBLICATIONS

International Organisation for Standardisation Organisation Internationale De Normalisation, "Generic Coding of Moving Pictures and Associated Audio: Systems", ISO/IEC JTC1/SC29/WG11/N0801, Nov. 13, 1994.

\* cited by examiner

Primary Examiner—Peguy JeanPierre
Assistant Examiner—Joseph Lauture
(74) Attorney, Agent, or Firm—Beyer, Weaver &Thomas,LLP (57) ABSTRACT

A system for decoding variable length codes comprises a window buffer, a unique variable length code look-up table and a decoder. The window buffer is coupled to receive a bit stream and provides a window output having the same number of bits in the longest variable length code. The output of the window buffer is coupled to address the variable length code look-up table. The look-up table has entries pre-calculated based on the variable length code book and is pre-stored in the system. The window buffer can have a size of any number of bits from X to Y where X is the number of bits in the longest variable length code and Y is a number greater than X. The output of the variable length code look-up table is provided to the decoder. The output of the variable length code look-up table includes the code specified by the bits, and a number of bits that the window buffer should be incremented. This number is in turn used by the decoder to increment the window buffer. The present invention is particularly advantageous because with a modest increase in the size and format of the variable length code look-up table, the decoder in a single computation can determine the code.

19 Claims, 8 Drawing Sheets

SYSTEM AND METHOD FOR THE DECODING OF VARIABLE LENGTH CODES

BACKGROUND OF THE INVENTION

1. Field of the Invention

The present invention relates generally to systems and methods for encoding and decoding variable length codes. In particular, the present invention relates to a system and a method for decoding bitstreams of variable length codes.

2. Description of the Related Art

Variable length coding (VLC) is well known in the areas of compression and transmission of digital data and is used to reduce the number of binary bits required to represent information. The basic idea behind variable length coding is very simple: in a binary representation of symbols in a given sequence of symbols, the more frequently used symbols should be represented by shorter binary codes, giving rise to the concept that different symbols ought to be represented by binary codes of different lengths, thus variable length codes. To illustrate the concept, assuming that a message consists of the following sequence of symbols: {a, b, a, c, b, c, a, a, a, c, c, a, b, a, c, b, c, a, a, b }. In this sequence, the message is represented by an alphabet of three letters. The relative frequency of the three symbols is:

frequency_a=9/20=0.45 frequency_b=1/4=0.25 frequency_c=3/10=0.3

Variable length coding replaces each letter by a binary sequence. Using the concept of VLC described above, letter 'a' should be represented by the shortest binary sequence: say, '0', letter 'c' should be the next shortest binary sequence '01', letter 'b' should be the longest, say, '010'. Such a scheme attempts to minimize the number of bits used to represent the symbol taking into consideration their frequency of presence in the sequence. The binary sequence used to represent the symbols is called a codeword. With this representation, the sequence is represented as the bit string {0010001010010000101001000101001000010}. One problem with this representation is that in order to recover the original message from the above, without knowing what the original message is, we may have reconstructed (decoded): {a, c, a, a, c, c, a. c . . . }. This is clearly different from the original. The reason is that the letter 'b' can also be interpreted as letter 'c' followed by 'a'. In other words, the binary representation of letter 'c' is a prefix of letter 'b'. To avoid this problem, all variable length codes must be of the so called prefix code, namely, no variable length code can be the prefix of another variable length code. In the above example, we can use the following representation:

'a'→'0', 'b'→'100', 'c'→'11'.

With this set of variable length codes, the message's binary representation becomes: {01000111001100011101000111001100100}. One can easily see from that the above binary sequence can be reverted uniquely back to the original message.

Another problem with variable length codes is the efficiency of the representation. Using the same example, we see that if we use:

'a'→'0', 'c'→'10', 'b'→'11'  (EQ 1)

that is another prefix code, the message can be represented by fewer number of bits: {01101011100001010011010111100011}. There are many way store present symbols using VLC. In addition, mathematically it is possible to create VLCs that are most efficient (i.e., no other VLC can be more efficient in terms of the number of bits used). In general, VLCs used in compression are aimed at the most optimal VLC representation based on the observed relative frequency.

The processing of representing symbols in a given message by variable length codes (VLCs) is called VLC Encoding, or simply VLE. The reverse process is called VLC Decoding, or VLD. The VLE and VLD are used together to create a more efficient binary representation of a given message at the source and reconstruct the message at the destination. The mapping between the message symbols and the binary sequences must be known by both source and destination beforehand. The mapping is called VLC table. Each VLC table has a number of entries; each entry in the table corresponds to the mapping between the message symbol and the corresponding binary sequence. In the example above, the mapping given in (EQ 1) can be shown in Table 1.

TABLE 1

An example VLC table

| Symbol | Binary representation |
|---|---|
| A | 0 |
| B | 11 |
| C | 10 |

The present invention is described below in the context of methods for VLD. In addition, the following description is limited to VLCs that are of prefix-code type (i.e., no variable length codeword is the partial prefix of another codeword).

A VLD algorithm is the reverse process that maps variable length code back to the original symbols. In compressed video signals such as MPEG-2, for example, many types of information in the elementary stream layer are represented as variable length codes to reduce the number of bits needed to represent the information. In the MPEG-2 decoder, such information must be recovered from the VLC codewords. For the ease of discussion, let's assume that a codeword, denoted by C, has N number of bits, where N vanes from codeword to codeword. Therefore, a sequence of M codewords can be denoted by $\{C_1, C_2, C_3, \ldots, C_M\}$, where the codeword $C_M$ has $N_M$ bits. The total number of bits of this sequence is given by:

$$\sum_{1 \leq m \leq M} N_m.$$

Figure 5:
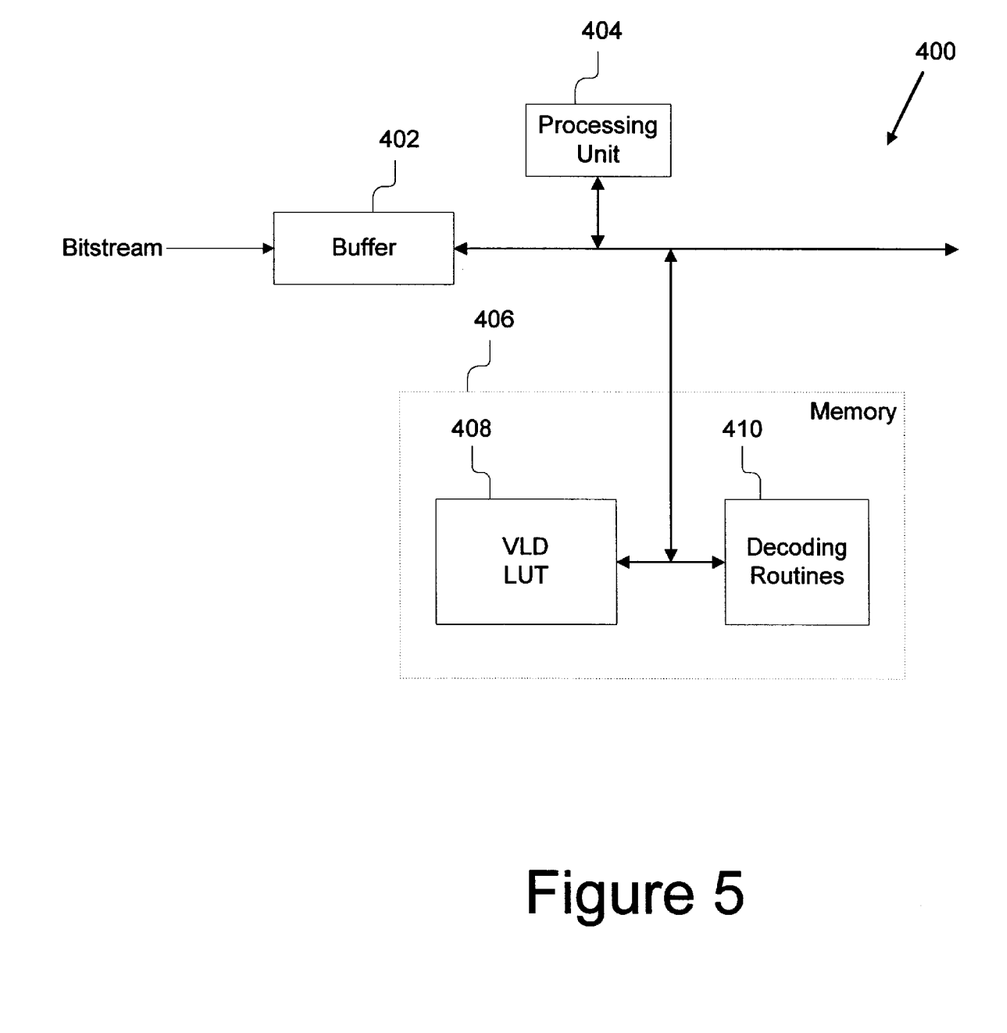
FIG. 5 is a block diagram illustrating a third embodiment for the variable length code decoder of the present invention where the decoder is implemented with a general-purpose computer.
Figure 6A:
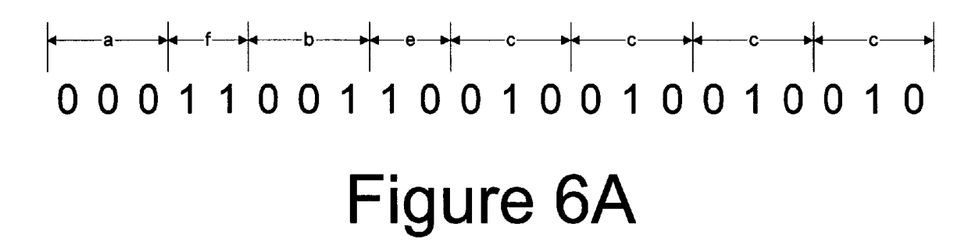
FIGS. 6A–6F illustrate a bit stream, corresponding codes generated, and a window used by the present invention and its movement.
Figure 6B:
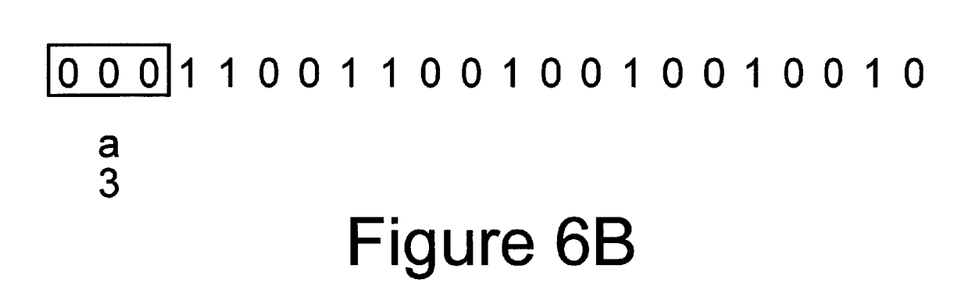
Figure 6C:
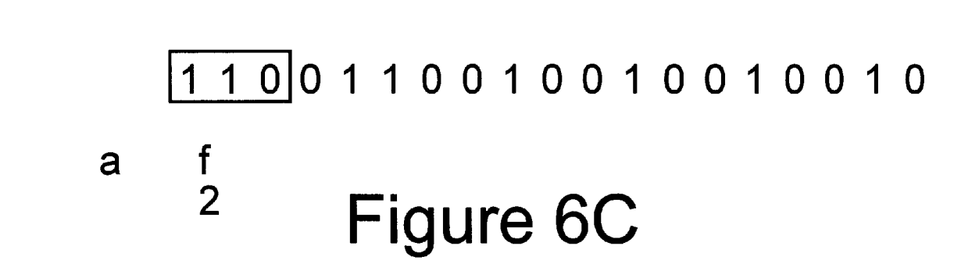
Figure 6D:
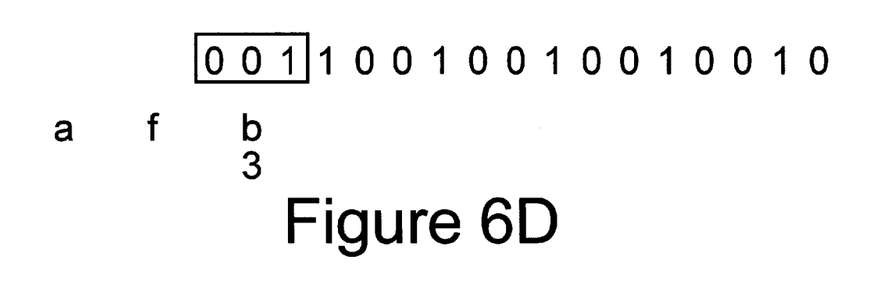
Figure 6E:
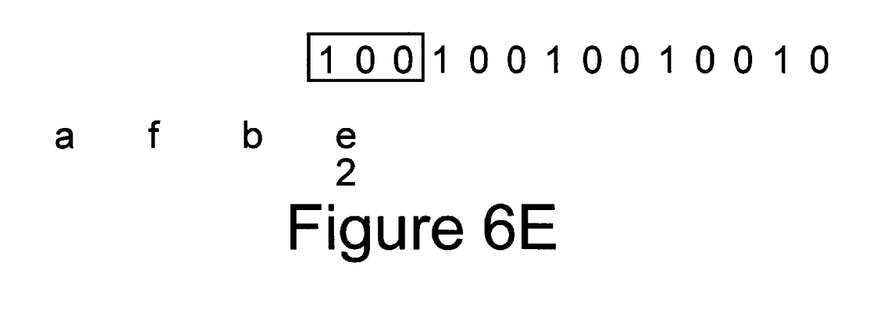
Figure 6F:
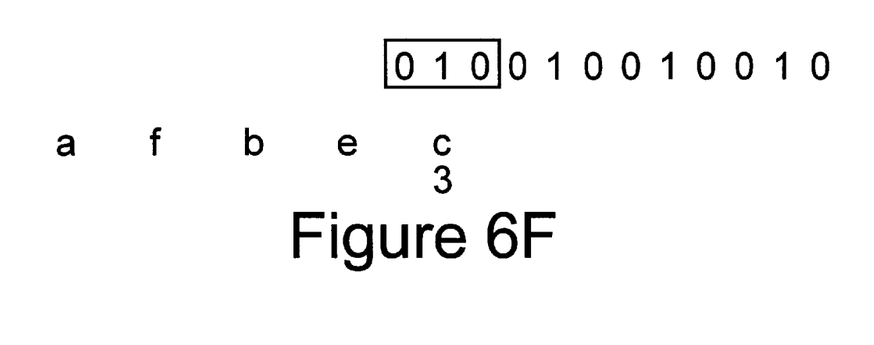

In addition, assuming that the codewords are received in the following order: $C_1$ then $C_2$ and so on. Corresponding to these codewords are the original symbols, denoted by $\alpha_1$, $\alpha_2, \alpha_3, \ldots, \alpha_M$, respectively. This can be illustrated as shown in FIG. 5.

Figure 1:
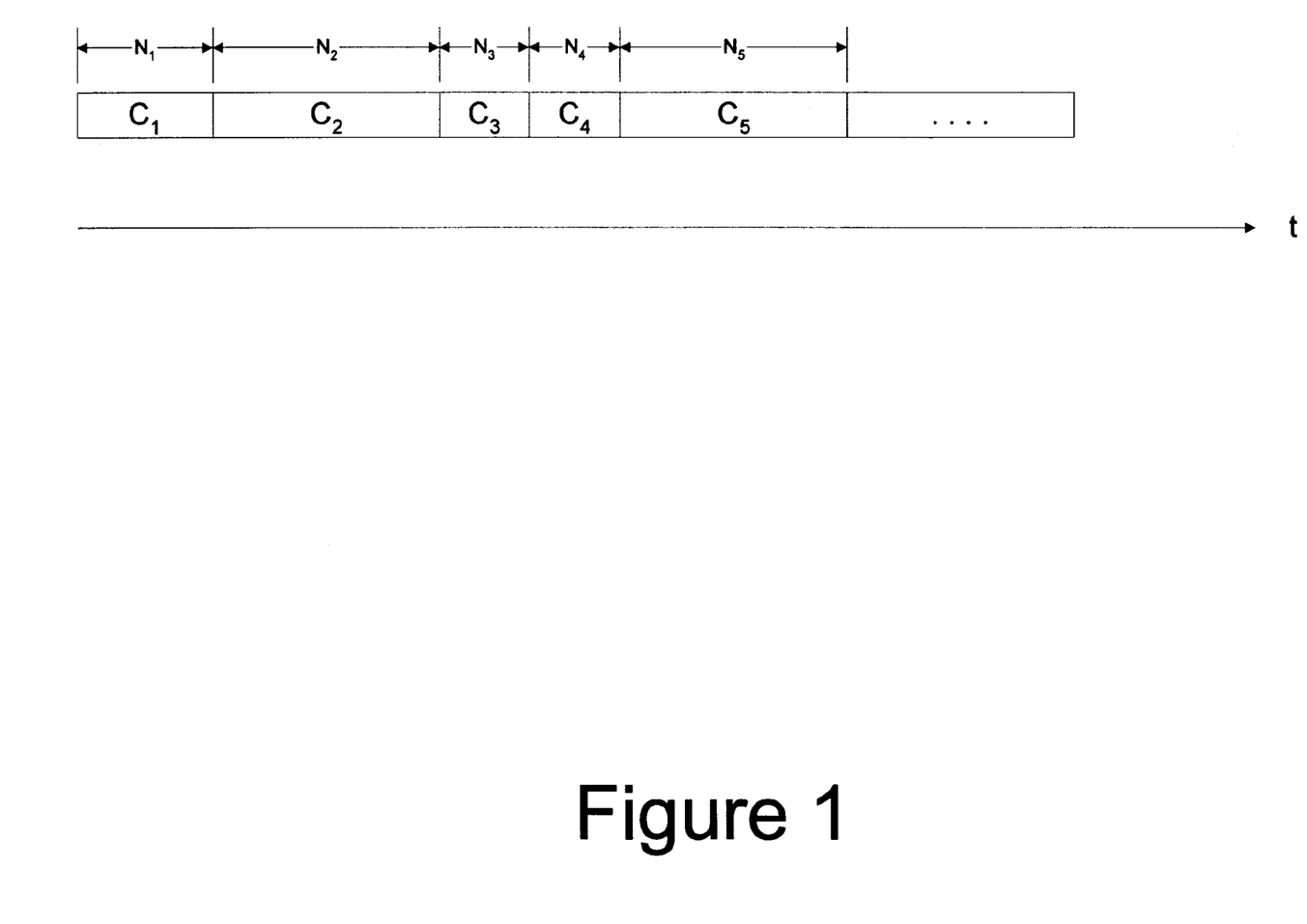
FIG. 1 is a diagram illustrating exemplary bitstreams and the des contained therein.
Figure 2:
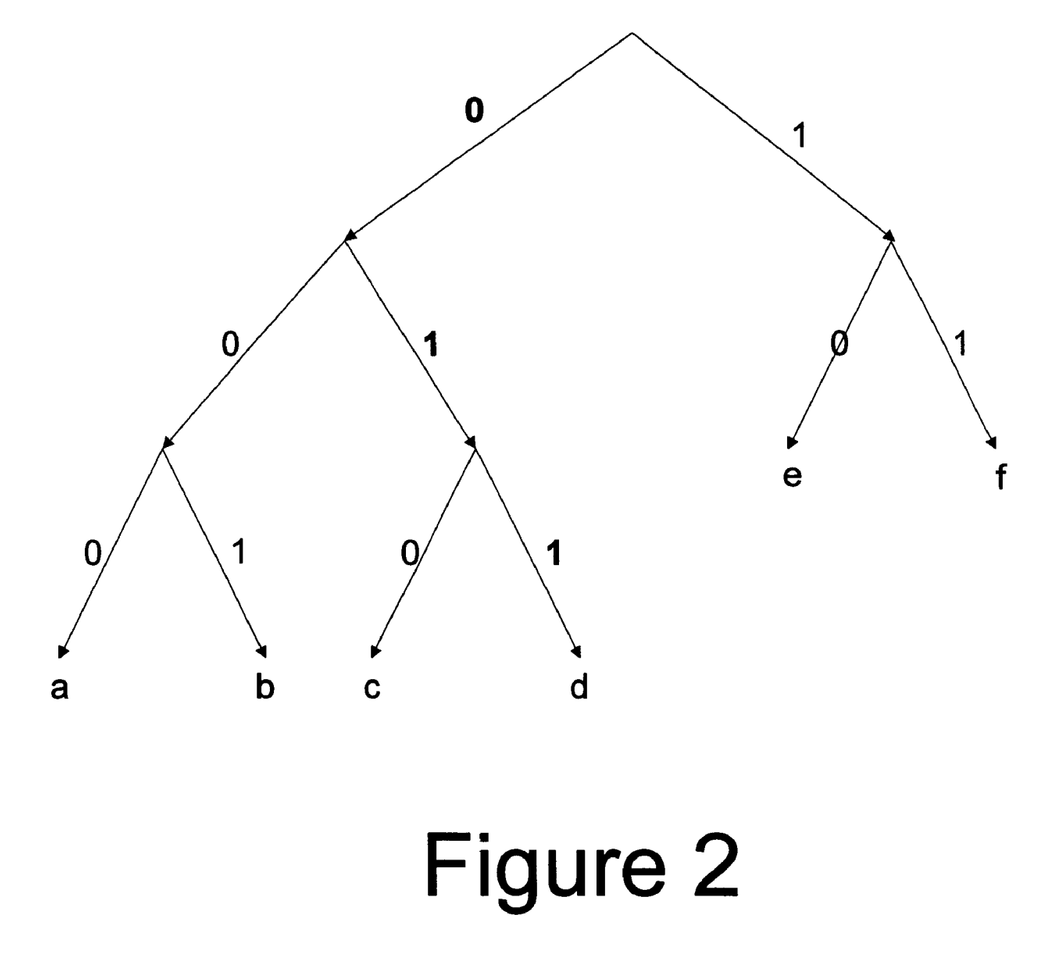
FIG. 2 is a diagram representing the prior art computational processing exemplary bitstreams and the codes contained therein.

Prior art methods decode VLCs by inspecting the codewords one bit at a time as the binary sequence is introduced into the decoder. As the bits are read, the decoder determines which VLC table entries have the matching bit patterns. There may be multiple entries that have partially matching bit patterns. But as more and more bits are read, the number of matching entries reduces, eventually down to a single entry as all bits of the codeword are read. When this last bit is read depends on the length of the codeword. For example, if the codeword has 10 bits, it will take up to 10 binary decisions to reach the final entry that matches the given codeword. To show the above decoding process graphically, the above-described algorithm corresponds to a tree traversing process. An example is shown in FIG. 2. In this example, the VLC table consists of 6 entries, representing 6 symbols, a, b, c, d, e, f. The VLC table is shown in Table 2. (Note that the VLC is of prefix-code type).

TABLE 2

| Symbol | codeword |
|---|---|
| A | 000 |
| B | 001 |
| C | 010 |
| D | 011 |
| E | 10 |
| F | 11 |

In the example shown in FIG. 2, an input codeword has 3 bits: '011', therefore, as the decoder accepts each bit, it makes a binary decision along the code tree: to traverse left or right. With the first bit being '0', it traverses left, possible decoded symbols are a, b, c, d. With the second bit being '1', it traverses right, possible decoded symbols are reduced to c, d. With the third and last bit being '1', it traverse right, leaving symbol d as the only symbol left. Therefore, after three such decisions, processing steps and memory accesses, it reaches the node d, which is the desired symbol. This is typical with the prior art, thus making VLD generally computationally intensive. Thus, there is a need to simplify or reduce the number of computations need for decoding and thereby reduce the time required for decoding.

Therefore, there is a need for a new system and a new method for performing decoding that is computationally inexpensive.

SUMMARY OF THE INVENTION

The present invention overcomes the deficiencies and limitations of the prior art with a system and a method for decoding variable length codes. A preferred embodiment of the system of the present invention comprises a window buffer, a unique variable length code look-up table and a decoder. The window buffer is coupled to receive a bit stream and provides a window output having the same number or more of bits in the longest variable length codeword. The output of the window buffer is coupled to address the variable length code look-up table. The look-up table has entries pre-calculated based on the variable length code book and is pre-stored in the system. The window buffer can have a size of any number of bits from X to Y where X is the number of bits in the longest variable length code and Y is a number greater than X. The output of the variable length code look-up table is provided to the decoder. The output of the variable length code look-up table includes the code specified by the bits, and a number of bits that the window buffer should be incremented. This is in turn used by the decoder to increment the window buffer. The present invention is particularly advantageous because with a modest increase in the size and format of the variable length code look-up table, the decoder in a single memory access can determine at least one code. This can generate significant computational saving particularly when real-time performance must be achieved with limited processor resources.

The method of the present invention for decoding variable length codes preferably comprises the steps of: receiving an input bit stream, defining a window of W bits, read data from memory using the bits in the window, determining whether the data read from memory is a code, generate the code using data read from memory, moving the window by t bits where t is a value read from memory, and repeating the above step until there are no more bits in the bit stream.

DETAILED DESCRIPTION OF THE PREFERRED EMBODIMENTS

Figure 3:
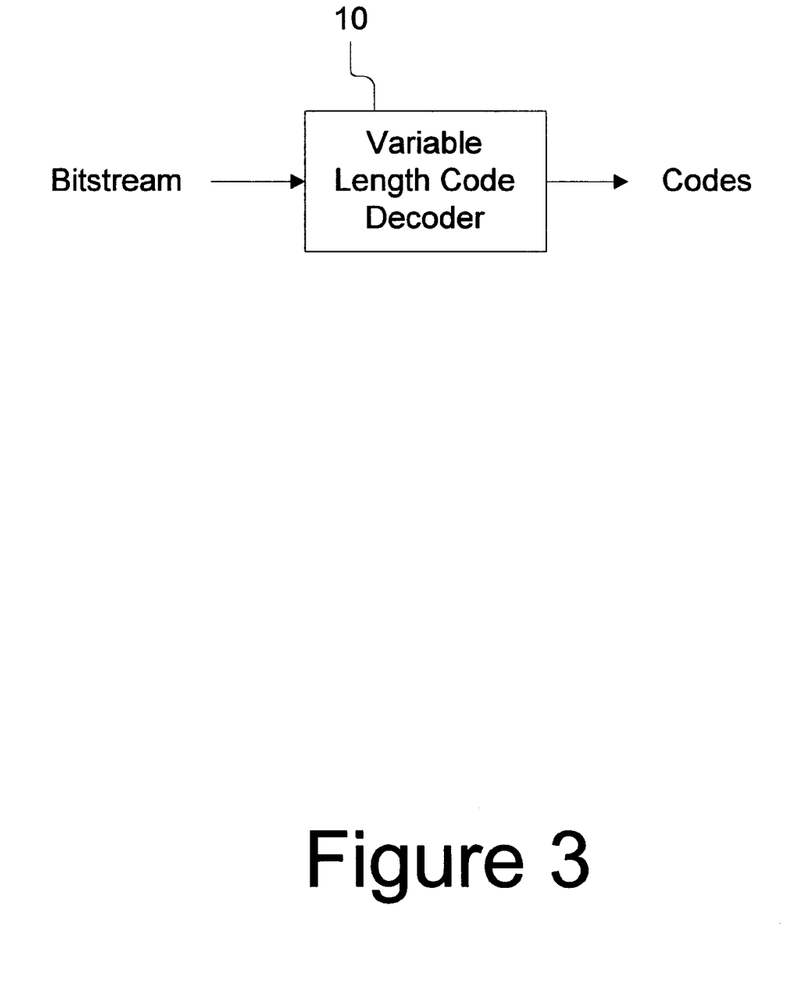
FIG. 3 is a block diagram illustrating a system including the variable length code decoder of the present invention.

Referring now to FIG. 3, the system 10 for decoding variable length codes in shown. The system 10 has an input and an output. The input of the system 10 is coupled to receive a bit stream containing a plurality of bits that represent variable length codes. The output of the system provides the codes that have been generated based on the input bit streams. As noted above, the system preferably operates on VLC of the prefix-code type. While the present invention will now be described below with regard to a particular set of variable length codes, those skilled in the art will recognize that the present invention may be used with any set of variable length codes regardless of the various lengths and codes used. The present invention provides a system 10 and method that are computationally efficient, but requires additional memory. This system 10 is preferable particularly in systems where real-time processing of VLD must be done with limited computing resources. The system 10, therefore, provides a performance and memory requirement trade-off of the VLD. For systems where computation resource is limited, the present invention provides improved performance at the expense of increased memory requirement.

Figure 4:
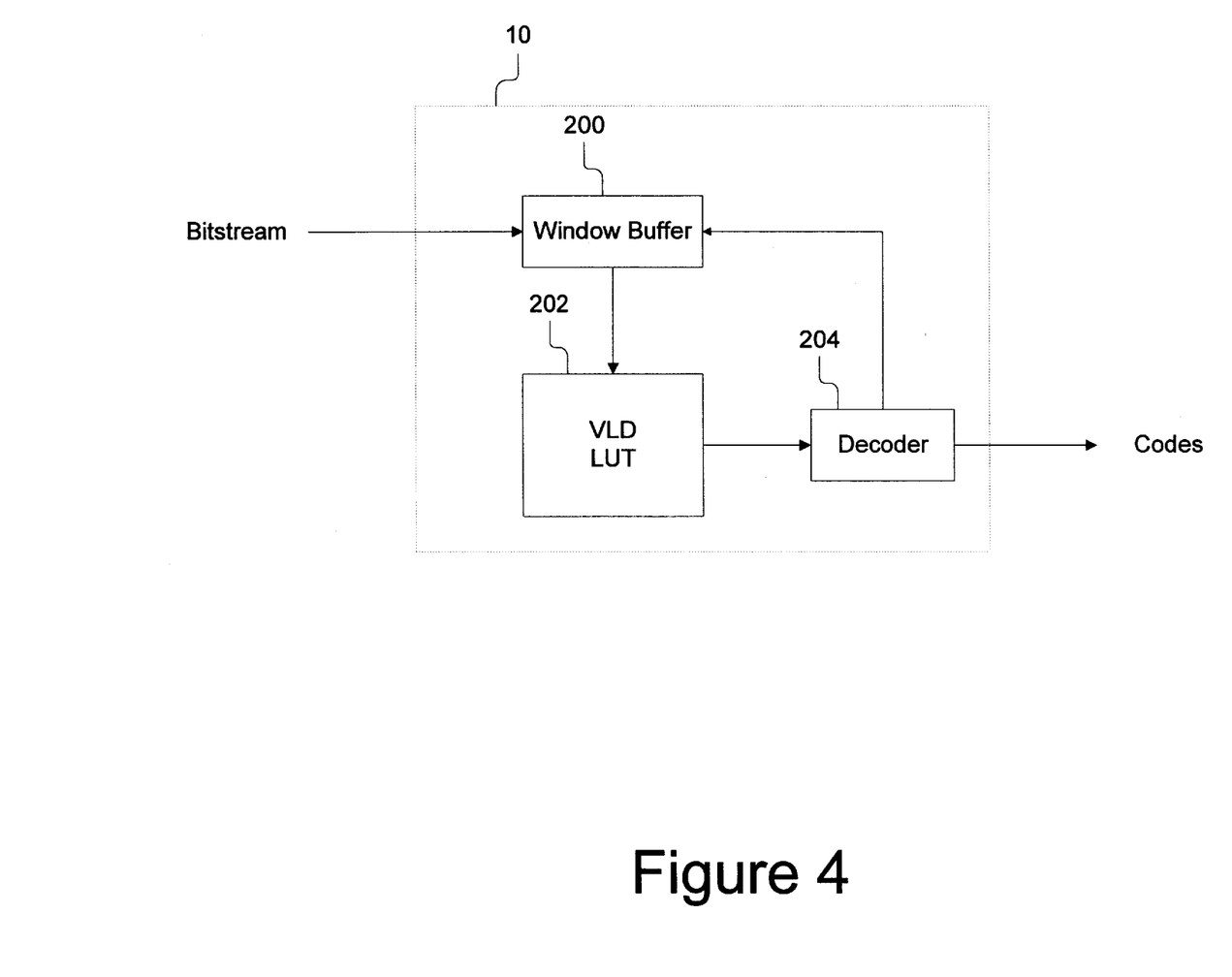
FIG. 4 is a block diagram illustrating a first and preferred embodiment for the variable length code decoder of the present invention.

Referring now to FIG. 4, a first and preferred embodiment of the system 10 is shown. The first and preferred embodiment of the present invention comprises a window buffer 200, a unique variable length code look-up table 202 and a decoder 204.

The window buffer 200 is coupled to receive a bit stream and provides a window output having the same number of bits in the longest codeword. A first output of the window buffer 200 is coupled to address the variable length code look-up table 202. In an exemplary embodiment, the window buffer 200 may be a serial in parallel out, FIFO buffer. The W oldest bits in the FIFO form the first output and are used to address the variable length code look-up table 202. The window buffer 200 may be incremented up to W number of bits in response to a signal on a second input of the window buffer 200. The window buffer can be incremented any number of bits from 1 to W where W is the number of bits in the longest variable length code. The second input is preferably coupled to an output of the decoder 204.

The look-up table 202 preferably has entries pre-calculated based on the variable length codebook and is pre-stored in the system 10. The output of the variable length code look-up table 202 is provided to the decoder 204. The look-up table 202 preferably has the following entries: 1) the number of symbols in this table entry, given by m (m=0 implies that there is no matching VLC pattern in this window of bits); 2) the total number of bits for the VLCs corresponding to these symbols given by t; 3) the list of symbols. An exemplary table having six symbols is shown in Table 3 below.

TABLE 3

| Symbol | VLC | t |
|---|---|---|
| a | 000 | 3 |
| b | 001 | 3 |
| c | 010 | 3 |
| d | 011 | 3 |
| e | 10 | 2 |
| f | 11 | 2 |

The output of the variable length code look-up table 202 includes the code specified by the bits, and a number of bits that the window buffer should be incremented. This is in turn used by the decoder 204 to increment the window buffer 200. Those skilled in the art will recognize that the variable length code look-up table 202 is preferably generated off line and stored in memory for use. In other words, the table is pre-stored before the decoding process starts. The symbols are advantageously decoded by a single memory access to the table.

In an alternate embodiment, the window W may be larger than the longest codeword length. With such embodiments multiple symbols could be decoded with a single memory access. The size of the window determines a trade-off of the algorithm. If W is small, fewer symbols can be decoded each time the table is looked up. If W is large, more symbols can be decoded in a single table look up. The cost for decoding additional symbols is the increased table size (number of entries) of the table, consuming more memory.

The decoder 204 has an input coupled to receive the data read out of the variable length code look-up table 202. The decoder 204 initializes the system 10 by aligning the window to contain the start of at least one codeword. In other words, the first bit inside the window 202 is also the first bit of a codeword. Given W bits, it is guaranteed to be at least as large as the longest VLC, there must be at least one codeword contained in this window. Using the bits within the window of length as the address, the variable length code look-up table 202 generates the symbols based on the table entry. The decoder generates a signal at a second output that is coupled to the control input of the window buffer 200 to the window forward by t bits and decode another codeword. After each codeword is decoded, the window buffer is moved t bits until there are no more bits in the bit stream. The present invention is particularly advantageous because with a modest increase in the size and format of the variable length code look-up table, the decoder in a single memory access can determine multiple codes. This can generate significant computational saving particularly when real-time performance must be achieved with limited processor resources.

Referring now to FIG. 5, a similar scheme can be implemented in software only. Specifically, the buffering, LUT accessing and decoding routines, can all be implemented by general-purpose computer processing units, instead of dedicated hardware. In such an embodiment, the invention comprises a processing unit 404 that is coupled by a bus to a variable length decoding look-up table (LUT) 408 and decoding routines 410. The decoding routines 410 are preferably stored in a conventional random access memory as will be understood to those skilled in the art. The routines 408 control the processing unit 404 to perform decoding consistent with the method of the present invention that is described below with reference to FIG. 7. The VLD LUT 408 is similar to the LUT 202 described above with reference to FIG. 4, however, as will be understood to those skilled in the art, the VLD LUT 408 is adapted for use with the processing unit 404.

Referring now to FIGS. 6A–6F, the bit stream, the bits within the window, codewords and the increment are shown for the exemplary case having 6 codewords and a maximum bit length of three.

Figure 7:
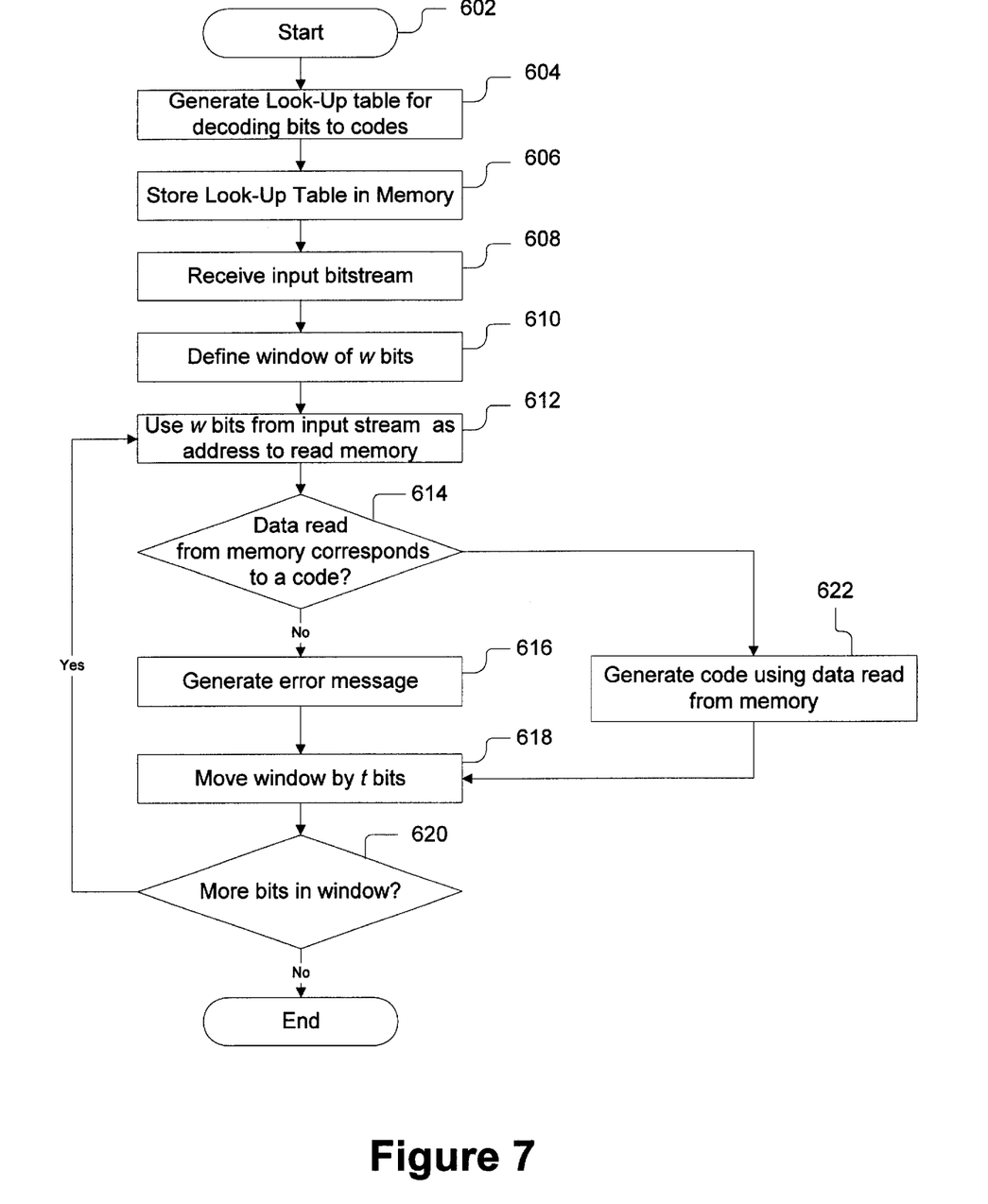
FIG. 7 is a flow chart of the preferred method for decoding variable length codes according to the present invention.

Referring now to FIG. 7, a flowchart of the preferred method according to the present invention is shown. The process begins in step 604 by generating a unique look-up table 202 for decoding the bits into codes as has been described above. Next in step 606, the method stores the look up table 202 in memory 406 that is part of the system 10. Then in step 608, an input bit stream is received. The input bit stream is divided so the most recently received portion is a defined in a window of W bits. For the example above W=3. Then in step 612, the system 10 uses the bits in the window as an address for reading data from the look-up table 202. Next in step 614, the method tests whether the data read from memory provides a valid code. If not, the method proceeds to step 616, where it generates an error code, and the to step 618 where the window is incremented by the amount read from memory. If there was a error, the it could mean lost bits misalignment or other errors, and the decoder will respond accordingly by deleting the bit string or just trying to extract codewords and assuming 1 to W bits have been lost. If in step 614, the method determines that the data read from memory provides a valid codeword, the method continues to step 622 to generate the decoded symbol identified the corresponding entry from the look-up table 202, and proceeds to step 618 to increment the window by t bits. Preferably t is a value specified as part of the entry value read from the look-up table 202. This will prepare the window for decoding the next word. Finally, in step 620 the method tests whether there are more bits in the window. If so the method returns to step 614 to generate the next code, otherwise the bit streams has completely been decoded and the method is complete.

In an alternate embodiment of the present invention, the above-described methods are modified to provide the most preferred method of the present invention. Specifically, a key benefit of the present invention is that it can decode multiple symbols from a single LUT access. Since memory access is often a major time consuming operation, limiting the dependence of decoding to a single look up table access provides significant computational efficiencies. Using the above example shown in FIGS. 6A–6F, the window size (window buffer 200 size) may be, for example, 6. In such a case, the first 6 bits in the window are: '000110'. Using these bits to address the LUT, the entry value of the LUT should contain the following information: [symbol1, length1, symbol2, length2, number_of_symbols_decoded]. An exemplary LUT would have a total of five columns, one for symbol1, length1, symbol2, length2 and number_of_symbols_decoded. For this example, symbol1='a', length1=3, symbol2='f', length2=2, number_of_symbols_decoded=2. Once the symbols are decoded, 'length1+length2'=5 bits are flushed out of the window buffer 200 and 5 more new bits are pushed into the window buffer 200 to prepare for the next LUT addressing operation. Therefore, the key benefit in the alternate embodiment is that the invention can produce multiple decoded symbols with a single LUT access. The price for such computational efficiency is that the hardware costs are increased by having to provide a larger LUT. In the extreme case for FIG. 6, the invention may include and use a window of size of 21 bits. Such a window covers the entire number of bits shown in FIG. 6A. Then with a single access, we can decode all of the 8 symbols. Of course, the price is that the LUT table has $2^{21}$ (too big) entries and each entry must hold up to 5 symbols, along with associated length.

While the present invention has been described with reference to certain preferred embodiments, those skilled in the art will recognize that various modifications may be provided. These and other variations upon and modifications to the preferred embodiments are provided for by present invention that is limited only by the following claims.

What is claimed is:

1. A device for decoding variable length codes, the device comprising:

window buffer having first input, a second input and an output, the window buffer storing a plurality of bits for use in addressing in response to a control signal on the second input, the first input of the window buffer coupled to receive a first bit stream;

a look-up table having an input and an output for generating at least one code and a signal indicating a number of codes being output, the input of the look-up table coupled to the output of the window buffer; and a decoder having an input, a control output and a data output for providing codes, the input of the decoder coupled to the output of the look-up table and the control output of the decoder coupled to the second input of the window buffer.

2. The device of claim 1, wherein the window buffer stores at least as many bits as a number of bits of a longest variable length codeword.

3. The device of claim 1, wherein the window buffer stores at least as many bits as two times the number of bits of a longest variable length codeword.

4. The device of claim 1, wherein the window buffer can be incremented any number of bits from X to Y where X is a number of bits in a longest variable length code and Y is a number greater than X.

5. The device of claim 1, wherein entries of the look-up table are pre-calculated based on a variable length code book and are pre-stored in the look-up table.

6. The device of claim 1, wherein each entry of the look-up table includes a symbol value specified by bits of the address applied to the look-up table, and a number of bits that the window buffer should be incremented.

7. The device of claim 1, wherein each entry of the look-up table includes a first code, a first number of bits in the first code, a second code, a second number of bits in the second code, and so on (not limited to only two code per LUT access) and a number of codes.

8. A system for decoding variable length codes, the system comprising:

a buffer having an first input, a second input and an output, the buffer storing a plurality of bits for use in addressing in response to a control signal on the second input, the first input of the buffer coupled to receive a first bit stream;

a processor for performing operations on data in response to memory instruction, the processor coupled to the buffer by a bus; and a a memory coupled to the processor by a bus, the memory storing a VLD look-up table, and decoding routines used to control the processor for generating at least one code and a signal indicating a number of codes being output.

9. The device of claim 8, wherein the buffer stores at least as many bits as a number of bits of a longest variable length codeword.

10. The device of claim 9, wherein the window buffer can be incremented any number of bits from X to Y where X is a number of bits in a longest variable length code and Y is a number greater than X.

11. The device of claim 9, wherein entries of the look-up table are pre-calculated based on a variable length code book and are pre-stored in the memory as the look-up table.

12. The device of claim 9, wherein each entry of the look-up table includes a code specified by bits of the address applied to the look-up table, and a number of bits that the window buffer should be incremented.

13. A method for decoding variable length codes, the method comprising the steps of:

receiving an input bit stream;

defining a window of W bits of the input bit stream;

reading data from memory using W bits in the window;

generating a code using data read from memory; and moving the window by t bits where t is a value read from memory, wherein the value for t is variable.

14. The method of claim 13, wherein the method further comprises the step of repeating the steps of defining, reading, generating and moving for the bits in the bitstream.

15. The method of claim 13, wherein the step of reading the data from memory includes applying the bits from the window as address inputs to a look-up table.

16. The method of claim 13, wherein the step of generating a code includes the step of determining a first portion of data read from memory that is code, and second portion of data read from memory that is the number of bits in the code.

17. The method of claim 13, wherein the step of defining a window includes the step of providing an input buffer, and loading the input buffer with W bits.

18. The method of claim 13, further comprising the step of wherein the step of defining a window includes the step of receiving t more bits from the bit stream and shifting the bits in the buffer by t bits.

19. The method of claim 13, wherein the value for t is set to a number equal to or greater than a sum of the number of bits used for each variable length code.

* * * * *